US009279862B2

(12) United States Patent
Gebreselasie et al.

(10) Patent No.: US 9,279,862 B2
(45) Date of Patent: *Mar. 8, 2016

(54) ELECTROSTATIC DISCHARGE PROTECTION FOR A MAGNETORESISTIVE SENSOR

(71) Applicant: International Business Machines Corporation, Armonk, NY (US)

(72) Inventors: Ephrem G. Gebreselasie, South Burlington, VT (US); Icko E. T. Iben, Santa Clara, CA (US); Alain Loiseau, Williston, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/529,326

(22) Filed: Oct. 31, 2014

(65) Prior Publication Data
US 2015/0123655 A1    May 7, 2015

Related U.S. Application Data

(63) Continuation of application No. 14/073,951, filed on Nov. 7, 2013, now Pat. No. 8,908,334.

(51) Int. Cl.
*G11B 5/39*     (2006.01)
*G01R 33/00*    (2006.01)
(Continued)

(52) U.S. Cl.
CPC ........ *G01R 33/0076* (2013.01); *G01R 33/0052* (2013.01); *G01R 33/09* (2013.01);
(Continued)

(58) Field of Classification Search
CPC ........ G11B 5/3106; G11B 5/33; G11B 5/332; G11B 5/39; G11B 5/40; G11B 5/3903; H01L 27/0255; H01L 27/0259

USPC ......... 360/323, 324.1, 324.11, 324.12, 324.2; 257/173
See application file for complete search history.

(56) References Cited

U.S. PATENT DOCUMENTS

| 5,587,857 A | 12/1996 | Voldman et al. |
| 5,748,412 A | 5/1998 | Murdock et al. |

(Continued)

FOREIGN PATENT DOCUMENTS

WO    03105227 A2    12/2003

OTHER PUBLICATIONS

Chun, J., "ESD Protection Circuits for Advanced CMOS Technologies", A dissertation submitted to the Department of Electrical Engineering and the Committee on Graduate Studies of Stanford University. Jun. 2006. 137 pages. Copyright by Jung-Hoon Chun 2006.

(Continued)

*Primary Examiner* — Jefferson Evans
(74) *Attorney, Agent, or Firm* — Penny L. Lowry; Randall J. Bluestone

(57) ABSTRACT

A method of designing, for a magneto-resistive (MR) sensor, a protection circuit having a first and a second N-channel field-effect transistor (NFET) and at least one positive-negative (PN) diode is disclosed. The method may include determining a safe operating voltage range for the MR sensor and determining, within the safe operating voltage range, a normal operating voltage range for the MR sensor. The method may also include determining a protection threshold voltage range outside of the normal operating voltage range and within the safe operating voltage range of the MR sensor. The method may also include selecting device parameters to configure the first and second NFETs and the at least one PN diode to, in response to a voltage applied to the MR sensor being within a protection threshold voltage range, limit, by shunting current, the voltage applied to the MR sensor.

20 Claims, 5 Drawing Sheets

(51) Int. Cl.
 H01L 27/02 (2006.01)
 G11B 5/40 (2006.01)
 G01R 33/09 (2006.01)
 G06F 17/50 (2006.01)
 G11B 5/60 (2006.01)

(52) U.S. Cl.
 CPC .............. *G06F17/5068* (2013.01); *G11B 5/39* (2013.01); *G11B 5/40* (2013.01); *G11B 5/6094* (2013.01); *H01L 27/0255* (2013.01)

(56) References Cited

U.S. PATENT DOCUMENTS

| | | | |
|---|---|---|---|
| 5,777,829 | A | 7/1998 | Voldman et al. |
| 6,704,173 | B1 | 3/2004 | Lam et al. |
| 6,710,983 | B2 | 3/2004 | Voldman |
| 6,891,702 | B1 | 5/2005 | Tang |
| 6,972,933 | B1 | 12/2005 | Wada et al. |
| 7,009,820 | B1 | 3/2006 | Hogg |
| 7,167,331 | B1 * | 1/2007 | Sutardja ................... 360/67 |
| 7,489,482 | B2 | 2/2009 | Ono et al. |
| 7,548,405 | B2 | 6/2009 | Czarnecki et al. |
| 8,107,196 | B2 | 1/2012 | Bandy, IV et al. |
| 8,199,444 | B2 | 6/2012 | Golcher et al. |
| 8,427,796 | B2 | 4/2013 | Worley et al. |
| 8,462,457 | B1 | 6/2013 | Sutardja |
| 8,514,534 | B2 | 8/2013 | Bandy, IV et al. |
| 8,760,791 | B1 | 6/2014 | Sutardja |
| 8,760,827 | B2 | 6/2014 | Campi, Jr. et al. |
| 8,890,248 | B2 * | 11/2014 | Pauletti et al. ................ 257/355 |
| 8,908,334 | B1 | 12/2014 | Gebreselasie et al. |
| 2002/0097532 | A1 * | 7/2002 | Voldman ..................... 360/323 |
| 2003/0210501 | A1 * | 11/2003 | Voldman ..................... 360/323 |
| 2005/0141143 | A1 * | 6/2005 | Ono et al. ................... 360/323 |
| 2006/0018070 | A1 | 1/2006 | Iben |
| 2008/0151447 | A1 | 6/2008 | Czarnecki et al. |
| 2008/0278835 | A1 | 11/2008 | Dakroub et al. |
| 2009/0059440 | A1 | 3/2009 | Moe et al. |
| 2009/0154031 | A1 | 6/2009 | Bumanlag et al. |
| 2012/0033332 | A1 | 2/2012 | Bandy, IV et al. |
| 2012/0075758 | A1 * | 3/2012 | Pugsley ......................... 361/56 |

OTHER PUBLICATIONS

Unknown, "Smart FET Protection Features", Enabling Energy Efficient Solutions, on Semiconductor, 25 pages, www.onsemi.com. http://www.onsemi.com/pub_link/Collateral/TND394-D.PDF.

Voldman, S., et al., "Electrostatic Discharge (ESD) Protection of Giant Magneto-resistive (GMR) Recording Heads With a Silicon Germanium Technology". 2004 EOS/ESD Symposium. ISBN 1-58537-063-0, 9 pages. © 2004 ESD Association.

Gebreselasie et al., "Electrostatic Discharge Protection for a Magnetoresistive Sensor," U.S. Appl. No. 14/073,951, filed Nov. 7, 2013.

Wallash et al., "Magnetic Changes in GMR Heads Caused by Electrostatic Discharge," IEEE Transactions on Magnetics, vol. 34, Issue 4, Jul. 1998, pp. 1519-1521 DOI: 10.1109120.706602.

Doan et al., "Reliability Characteristics of IrMn Dual Synthetic Spin Valves," IEEE Transactions on Magnetics, vol. 36, Issue 5, Sep. 2000, pp. 2608-2610 DOI: 10.1109/20.908531.

Iben, I., "Thermal characteristics of a PtMn GMR sensor subjected to square wave EOS pulses," 2006 Electrical Overstress/Electrostatic Discharge Symposium, Sep. 10-15, 2006, pp. 120-130 ISBN: 978-1-5853-7115-0.

Wallash et al., "A Study of Diode Protection for Giant Magnetoresistive Recording Heads," 1999 Electrical Overstress/Electrostatic Discharge Symposium, Sep. 28-30, 1999, pp. 385-390 DOI: 10.1109/EOSESD.1999.819088.

Iben et al., "Tunable Diode Protection for GMR and TMR Sensors," 29th Electrical Overstress/Electrostatic Discharge Symposium, Sep. 16-21, 2007, pp. 2B.3-1-2B.3-9 DOI: 10.1109/EOSESD.2007.4401741.

Iben, I., "A Study of Cable Discharge Events and Other Short Time Pulses of Cabled MR Sensors," 30th Electrical Overstress/Electrostatic Discharge Symposium, Sep. 7-11, 2008, pp. 262-271.

Tag-At et al., "A Study on the Application of On-Chip EOS/ESD Full-Protection Device for TMR Heads," 2010 32nd Electrical Overstress/Electrostatic Discharge Symposium, Oct. 3-8, 2010, pp. 1-8.

Lauritzen et al., "A Simple Diode Model with Reverse Recovery," IEEE Transactions on Power Electronics, vol. 6, Issue 2, Apr. 1991, pp. 188-191 DOI: 10.1109/63.76804.

Ma et al., "A Simple Power Diode Model with Forward and Reverse Recovery," IEEE Transactions on Power Electronics, vol. 8, Issue 4, Oct. 1993, pp. 342-346 DOI: 10.1109/63.261002.

Yamazaki et al., "Forward Transient Behavior of PiN and Super Junction Diodes," Proceedings of 2004 International Symposium on Power Semiconductor Devices and ICs, May 24-27, 2004, pp. 197-200 DOI: 10.1109/ISPSD.2004.1332899.

Batard et al., "New High Power Diode Model With Both Forward and Reverse Recovery," Fifth International Conference on Power Electronics and Variable-Speed Drives, Oct. 26-28, 1994, pp. 447-452 DOI: 10.1049/cp:19941007.

Manouvrier et al., "Characterization of the Transient Behavior of Gated/STI Diodes and their Associated BJT in the CDM Time Domain," 29th Electrical Overstress/Electrostatic Discharge Symposium, Sep. 16-21, 2007, pp. 3A2-1-3A.2-10 DOI: 10.1109/EOSESD.2007.4401748.

Gauthier et al., "Investigation of Voltage Overshoots in Diode Triggered Silicon Controlled Rectifiers (DTSCRs) Under Very Fast Transmission Line Pulsing (VFTLP)," 31st EOS/ESD Symposium, Aug. 30-Sep. 4, 2009.

Simmons et al., "High-Pinning Iridium—Manganese—Chromium (IrMnCr) Read Sensors for High Reliability & Stability," Hitachi Global Storage Technologies, © 2006 Hitachi Global Storage Technologies.

Grund et al., "VF-TLP Systems Using TDT and TDRT for Kelvin Wafer Measurements and Package Level Testing," Electrical Overstress/Electrostatic Discharge Symposium, Sep. 19-23, 2004, pp. 1-8 DOI: 10.1109/EOSESD.2004.5272811.

Iben, I., "A Thermodynamic Study of ESD and EOS Induced Pinned Layer Reversal in GMR Sensors," 31st EOS/ESD Symposium, Aug. 30-Sep. 4, 2009.

Iben, I., "Dynamic Temperature Rise of Shielded MR Sensors During Simulated Electrostatic Discharge Pulses of Variable Pulse Width," 2004 Electrical Overstress/Electrostatic Discharge Symposium, Sep. 19-23, 2004, pp. 1-10 DOI: 10.1109/EOSESD.2004.5272812.

Iben et al., "Diode Protection of GMR Sensors", 2011 33rd Electrical Overstress/Electrostatic Discharge Symposium (EOS/ESD), Sep. 11-16, 2011, pp. 1-11, Anaheim, CA, 978-1-58537-193-8.

U.S. Appl. No. 14/635,005 entitled "Method to Protect Sensitive Devices From Electrostatic Discharge Damage", filed Mar. 2, 2015.

\* cited by examiner

ELECTROSTATIC DISCHARGE PROTECTION FOR A MAGNETORESISTIVE SENSOR

TECHNICAL FIELD

The present disclosure relates to electrostatic discharge (ESD) in magnetoresistive (MR) sensors. In particular, this disclosure relates to an MR sensor ESD protection circuit having activation characteristics compatible with the sensor it protects.

BACKGROUND

Magnetoresistive (MR) sensors may be used to read data recorded at high densities on magnetic media such as magnetic tape or hard disk drive platters. The trend of decreasing feature sizes of magnetoresistive sensors can make them increasingly vulnerable to voltages and currents outside of a sensor's specified safe operating voltage range. One type of voltage excursion outside of the specified safe operating voltage range may be electrostatic discharge (ESD). ESD events can cause permanent damage to thin film layers of MR sensors such as insulating barriers (dielectric layers) and resistor metallization.

In order to function properly and avoid being damaged by ESD, MR sensors may need to be protected from voltages outside their specified safe ranges of operation. A protection circuit closely coupled to the sensor may be used to shield sensitive electrical regions and structures within the sensor from damage due to ESD events, and may ensure continued reliable functioning of the sensor.

SUMMARY

Various aspects of the present disclosure may be useful for providing protection of magnetoresistive (MR) sensors from failures due to electrostatic discharge (ESD) events. An MR sensor configured according to embodiments of the present disclosure may perform reliably, while experiencing little (or no) loss of performance, resulting from the use of an MR sensor protection circuit.

Embodiments may be directed towards a method of designing, for a magneto-resistive (MR) sensor, a protection circuit having a first N-channel field-effect transistor (NFET), a second NFET and at least one positive-negative (PN) diode. The method may include determining a safe operating voltage range for the MR sensor and determining, within the safe operating voltage range, a normal operating voltage range for the MR sensor. The method may also include determining a protection threshold voltage range that is outside of the normal operating voltage range for the MR sensor and within the safe operating voltage range of the MR sensor. The method may also include selecting device parameters to configure the first NFET, the second NFET and the at least one PN diode to, in response to a voltage between a positive terminal and a negative terminal of the MR sensor being within a protection threshold voltage range, limit, by shunting current, the voltage between the positive terminal and the negative terminal.

Embodiments may also be directed towards a method for designing a protection circuit for a magneto-resistive (MR) sensor. The method may include selecting device parameters for a first N-channel field-effect transistor (NFET) and a second NFET within the protection circuit and configuring at least one positive-negative (PN) diode within the protection circuit. The method may also include adjusting device parameters for the first NFET, for the second NFET and for the at least one PN diode and selecting substrate bias voltages for the first NFET and for the second NFET. The method may also include configuring a forward-biased diode and a reverse-biased diode within the protection circuit and adjusting device parameters for the at least one PN diode, the forward-biased diode and the reverse-biased diode.

Aspects of the various embodiments may be used to limit voltage applied to the MR sensor. Aspects of the various embodiments may also be useful for providing cost-effective protection circuits for use with MR sensors, by using existing and proven integrated circuit (IC) and MR sensor technologies.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Figure 1:
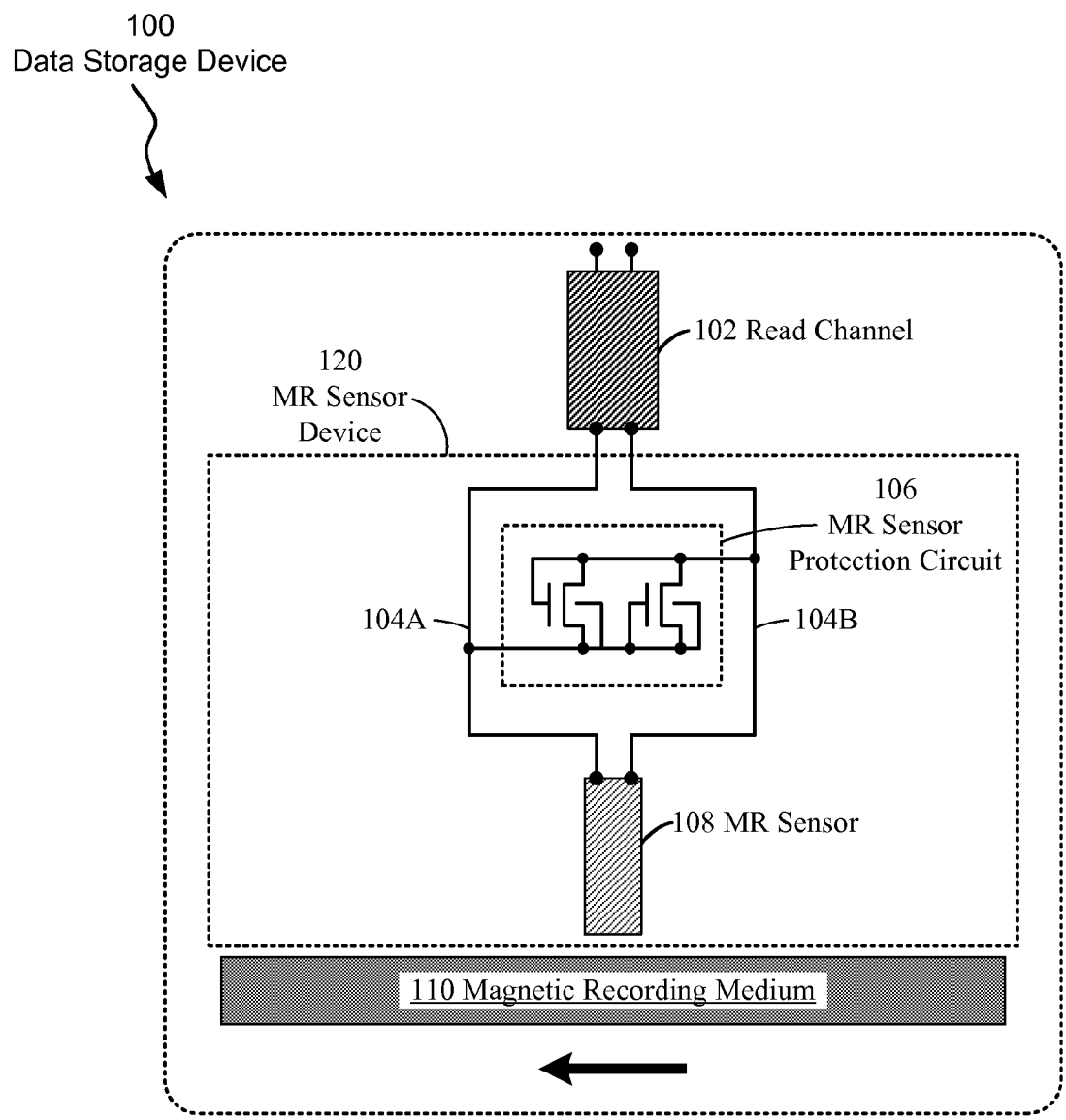
FIG. 1 is a block diagram representation of a data storage device including a read channel, a magnetoresistive (MR) sensor protection circuit, an MR sensor, and a recording medium, according to embodiments of the present disclosure.

Certain embodiments of the present disclosure can be appreciated in the context of a circuit for electrostatic discharge (ESD) protection of a magnetoresistive (MR) sensor that may be used for reading data stored on magnetic media. Such media types may include, but are not limited to, magnetic tape and hard disk drive platters. While not necessarily limited thereto, embodiments discussed in this context can facilitate an understanding of various aspects of the disclosure. Certain embodiments may also be directed towards other equipment and associated applications, such as an ESD protection circuit for use with, or inclusion within, integrated circuits (ICs) having a high sensitivity to ESD events. Such ICs may include, but are not limited to, analog and digital circuits fabricated in various semiconductor technologies. Embodiments may also be directed towards protecting other types of devices that include MR sensors, such as microelectromechanical systems (MEMS), biosensors, and magnetoresistive random-access memory (MRAM), from damage due to ESD events.

Various embodiments of the present disclosure relate to MR sensor ESD protection circuits configured to limit the voltage across the terminals of an MR sensor by shunting excess current, which can be useful for providing robust protection of MR sensors from damage due to ESD events. MR sensor reliability may result from the use of MR sensor protection circuits. The MR sensor protection circuit may protect sensors from both positive and negative ESD events, and may be configured to be compatible with a variety of unique MR sensor characteristics and operating conditions, to provide robust protection while not limiting MR sensor bandwidth or sensitivity.

An MR sensor protection circuit designed according to certain embodiments may be compatible with existing and proven IC technologies and MR sensor types, and may be a useful and cost-effective way to protect costly MR sensors from permanent damage. An MR sensor protection circuit constructed according to embodiments of the present disclosure may protect an MR sensor from the destructive effects of ESD events, which may originate from a variety of sources during the manufacturing, test, and usage of the MR sensor.

Magnetoresistance may be the characteristic of a material to change its electrical resistance value in response to an external magnetic field applied to it. Magnetoresistive (MR) devices such as sensors can be highly sensitive to small transitions in magnetic fields (magnetic flux), and can be fabricated to very small dimensions. For example, giant magnetoresistance (GMR) sensors may include layered thin-film structures including alternating ferromagnetic and non-magnetic conductive layers, and may exhibit a significant change in electrical resistance (20%, in some applications) in response to an applied magnetic field. A conductive copper layer of a GMR sensor may have a thickness of between 1 nm and 3 nm. Tunnel magnetoresistance (TMR) sensors may include ferromagnet (FM) and a magnetic fee (FL) layers, separated by a thin tunnel junction (TJ) insulator. If the insulating layer is thin enough (for example, less than 5 nm), electrons may tunnel between the FM and the FL layers, causing the TMR to be exhibit resistive rather than insulating behavior. The amount of tunneling current may depend on the magnetization alignment of the two layers adjacent to the TJ insulator. When the magnetizations of the two layers are aligned (anti-aligned), the resistance may be the lowest (highest). Magnetic transitions, for example, on a magnetic media, may be detected with a TMR by sensing a change in resistance resulting from the rotation of the FL magnetization. A change in the TJ resistance may be sensed as a change in voltage for a biased TMR sensor.

The described properties of MR sensors may make them useful for reading digital data, stored as densely packed magnetized regions, from the surface of a magnetic media, such as magnetic tape, or a hard disk drive platter.

Aspects of the present disclosure relate to recognitions about trends towards smaller MR sensor feature dimensions which can be driven by both the operating principles of the sensors and by a trend of increasing data density (resulting in smaller magnetic regions) on magnetic media. For example, the TJ layers of extant TMRs used in the hard disk drive (HDD) industry for reading data written on magnetic disks may have a thickness of between 0.5 and 1 nm. The small geometries of MR sensor elements may make them highly sensitive and susceptible to catastrophic (non-repairable) damage due to low-voltage ESD events (the sudden flow of electricity between two electrically charged objects). An MR sensor may be physically damaged, for example, by a voltage as low as 0.5 V, which may be substantially lower than voltages at which other electronic devices, such as ICs experience ESD damage. For example, a complementary metal-oxide-semiconductor (CMOS) IC may only suffer ESD damage at voltages above 2.0 V. The voltage at which a particular type of MR sensor may be damaged may depend on factors such as the sensor type (e.g., GMR or TMR), physical feature dimensions (layer thicknesses, media read track width) and the materials used in the sensor's fabrication.

Thin-film dielectric structures within TMR sensors may have low breakdown voltages. For example, TMRs with a TJ between 0.5 nm and 1 nm may be susceptible to dielectric breakdown from ESD events having durations as small as 1 ns, and at voltage levels between 0.5 V and 2 V. Dielectric structures may break down, and resistive structures may be damaged by interlayer diffusion of the metal layers, thermal and current (electromigration) induced magnetic damage, or melting, which may result from excess current through, and voltage across, the MR sensor's terminals. MR sensors may therefore require unique circuits, specifically configured to protect them from irreparable ESD-related damage.

Protection circuits may be designed to reduce or eliminate the effects of ESD events, and may be particularly useful in protecting MR sensors, and ensuring reliable and stable sensor operation. An ESD event may occur during the manufacturing, testing, or use of the sensor. As an example, during sensor testing, a cable, to which the MR sensor is connected (for test or operational purposes), may acquire a static charge, and may then discharge into the MR sensor upon electrical connection to a piece of electrical equipment, or upon accidental contact with a metal object. ESD events resulting from contact with charged manufacturing equipment, or a human body may also cause irreparable damage to the sensor.

An MR sensor may be used by applying an operating current across its terminals, which may produce a normal operating voltage drop across the sensor. For example, a nominal operating current (e.g., 2 mA) applied to an MR sensor having a resistance of 100 Ohms may result in a 0.2 V drop across its terminals. The sensor may, for example, experience damage at a voltage above 0.5 V, which may result in a relatively small operating voltage margin (0.5 V−0.2 V=0.3 V). An MR sensor protection circuit may need to activate (shunt current) within the 0.3 V operating voltage margin in order to effectively protect the MR sensor from ESD damage, by limiting the voltage across it to within the safe operating voltage range.

A safe operating voltage range may be understood to be the voltage range within which an MR sensor may be operated without causing physical or electrical damage to it, for example, between −0.5 V and +0.5 V. The safe operating voltage range of an MR sensor may depend on the sensor's type (e.g., GMR or TMR), dimensions of the physical features of the sensor, and the materials used to manufacture it.

An MR sensor protection circuit may be fabricated by connecting silicon PN diodes across an MR sensor's terminals, in order to limit voltage across the MR sensor by shunting current away from the terminals. A PN diode may have a threshold voltage ($V_T$) of approximately 1.0 V, above which voltage it may begin to conduct sufficient current to limit the voltage across the MR sensor's terminals. An MR sensor may be damaged by voltages outside of the safe operating voltage range (e.g., −0.5 V to +0.5 V), that are not protected against by an MR sensor protection circuit. In this example, voltages in the range between +0.5 V and +1.0 V may cause damage the MR sensor and may not be limited by a silicon PN diode.

Similarly, a silicon controlled rectifier (SCR) may be used in a protection circuit, but may generally begin to turn on at voltages above 0.5 V, possibly exposing the MR sensor to damage from ESD events at voltages above 0.5 V and below the voltage at which the SCR may begin to shunt current.

A Schottky diode may also be used in fabricating an MR sensor protection circuit. A Schottky diode, when forward-biased, may have a voltage drop between approximately 0.15 V and 0.45 V, and may have a relatively high on resistance (e.g., 9 Ohms), which may not allow sufficient current to be shunted across it to limit the voltage across the MR sensor to prevent ESD damage. For example it may not be possible to design a Schottky or a PN diode to shunt currents greater than 100 mA, at forward voltages less than 1.0 V. Similar to the Schottky diode, a dissipative shunt may be used, but may not directly protect the sensor from ESD pulses, due to its relatively high impedance (e.g., between 10 kohms and 1 megohm). A dissipative shunt, may, however may be useful in protecting a sensor from ESD damage, by dissipating static charge which may accumulate on cables attached to the sensor.

Consistent with embodiments, an effective ESD protection circuit may be designed to limit a voltage that increases above a specified threshold, before it can damage the MR sensor. In order for this circuit to be effective, it may begin to shunt current in response to a voltage across its terminals, consistently and sufficiently less than the minimum voltage at which the MR sensor may be damaged, for example, 0.5 V.

The ESD protection circuit may be robust enough to carry sufficient current (e.g., greater than 100 mA) to effectively limit the transient voltage level (resulting from an ESD event), across an MR sensor. Generally, increased ESD protection levels may be realized by decreasing the shunt resistance of an ESD protection circuit, allowing it to shunt higher amounts of current. The protection circuit may need to be located close to the protected MR sensor, and not be subject to electrical parasitic factors such as electronic package inductance or capacitance, or propagation delay.

While all figures illustrate the principles and features of the present disclosure, additional embodiments may include modifications to and variations of circuitry depicted, within the scope and spirit of the disclosure.

Certain embodiments relate to protection of MR sensors from destructive consequences of ESD events. FIG. 1 is a block diagram depiction of an MR sensor protection circuit 106, generally used for protecting MR sensor 108 from damage due to ESD events, according to embodiments of the present disclosure. An MR sensor device 120 includes MR sensor 108 coupled by nodes 104A and 104B to MR sensor protection circuit 106. A data storage device 100 may include MR sensor 108, MR sensor protection circuit 106, and read channel 102, which may be interconnected by nodes 104A and 104B, and which may be used together to read data stored on magnetic recording medium 110. Data storage device 100 may be a magnetic data storage device or system, such as a hard disk drive or a magnetic tape drive, consistent with data storage devices used in computer systems, and recording medium 110 may be a hard disk drive platter, or magnetic tape, respectively. Data stored on recording medium 110 may be recorded at a high density. MR sensor protection circuit 106 may be particularly useful in ensuring the reliability of MR sensor 108 and data storage device 100.

MR sensor protection circuit 106 may include FET devices designed and manufactured to have electrical characteristics such as a voltage threshold ($V_T$) and leakage current levels suitable for protecting MR sensor 108 from damage due to ESD events. ESD events may include voltage spikes or excursions that cause irreparable physical and/or electrical damage to MR sensor 108, and which may cause subsequent failure of MR sensor 108 and data storage device 100. ESD events may include events of both polarities, i.e.; events where the voltage on node 104A exceeds, in a positive direction, the voltage on node 104B, and events where the voltage on node 104B exceeds, in a positive direction, the voltage on node 104A.

Consistent with certain embodiments, MR sensor protection circuit 106 and MR sensor 108 may be fabricated using different technologies and/or processes, and therefore MR sensor protection circuit 106 may include devices not necessarily located on or within the MR sensor 108. MR sensor protection circuit 106 may be located close to MR sensor 108, for example, bonded adjacent to it on a ceramic or ferrite substrate, a flex cable, or on a hard disk drive read arm.

Limiting the distance between the MR sensor protection circuit 106 and the MR sensor 108 may facilitate electrical interconnection and mitigate the effects of electrical interconnect parasitics, such as resistance, capacitance, inductance and propagation delay. Such parasitics may diminish the effectiveness of MR sensor protection circuit 106. MR sensor 108 may be placed near moving magnetic recording medium 110 during a read operation.

When MR sensor 108 is being used to read data from the magnetic recording medium 110, the read channel 102 may drive a current (e.g., 1-3 mA) through MR sensor 108, which may cause a voltage drop between the terminals of MR sensor 108. A TMR sensor, for example, may have a 0.1 V to 0.2 V drop across its terminals (nodes 104A and 104B) while being used for reading data. In response to magnetic transitions (corresponding to recorded data) on the (moving) magnetic recording medium 110, the resistance of the MR sensor 108 may fluctuate, which may cause variation of the voltage across the terminals of MR sensor 108. The read channel 102 may detect these changes in voltage, amplify and convert them to signals that are sent to other circuits within the data storage device 110.

While the MR sensor 108 is being used to read data, in the absence of an ESD event, the voltage across nodes 104A and 104B of the MR sensor 108 may remain in a normal operating voltage range, for example between 0.0 V and 0.2 V. The normal operating voltage range may be a range of operating voltages specified by a manufacturer of an MR sensor, to ensure robust and reliable operation of the MR sensor. The normal operating voltage range may be within the safe operating voltage range. During a normal read operation, the voltage across the sensor terminals may generally not exceed the normal operating voltage range. In this voltage range, MR sensor protection circuit 106 may be configured to not shunt current across the terminals of the MR sensor 108. Shunting current may interfere with the read operation by adding unacceptable levels of noise to, or diminishing the bandwidth and/or sensitivity of the MR sensor 108.

When the MR sensor 108 experiences an ESD event (voltage transient), the voltage across nodes 104A and 104B may exceed the MR sensor's 108 normal operating voltage range. In response to the MR sensor's voltage entering this protection threshold voltage range, MR sensor protection circuit 106 may create a current shunt path between nodes 104A and 104B of the MR sensor 108, which may protect it from ESD damage by limiting the voltage across its terminals. The MR sensor protection circuit 106 may shunt sufficient current to limit the voltage across nodes 104A and 104B to a safe operating voltage range (e.g., between 0.0 V and 0.5 V), within which, the MR sensor may not be damaged by the voltage across its terminals. The MR sensor protection circuit 106 may be configured to activate in response to ESD events of either polarity. An MR sensor protection circuit may be configured to have a positive protection threshold voltage range, outside of and above the normal operating voltage range and within the safe operating voltage range.

An MR sensor protection circuit may be also configured to have a negative protection threshold voltage range, outside of and below the normal operating voltage range and within the safe operating voltage range. The MR sensor protection circuit may be activated in response to a voltage level within either the positive protection threshold voltage range or the negative protection threshold voltage range, and subsequently enable a current shunt path between the terminals of the MR sensor. In the described example, the positive protection threshold voltage range may be between a maximum voltage of the normal operating voltage range (0.2 V) and the maximum voltage of the safe operating range (0.5 V).

FIG. 1 depicts the MR sensor protection circuit 106, coupled to MR sensor 108 and read channel 102, and configured to protect MR sensor 108 from catastrophic damage due to ESD events. According to embodiments of the present disclosure, the MR sensor protection circuit 106 may provide high reliability data storage for a computer or other electronic system through shielding MR sensor 108 from electrical events which may render it inoperable. Protection of MR sensor 108 may also result in reduced overall system costs for data storage device 100, resulting from a limited failure rate of MR sensor 108. Embodiments of the present disclosure may be implemented on an integrated circuit (IC), which may be assembled with MR sensor 108 in a variety of configurations, consistent with available IC and electronic packaging technologies.

Figure 2:
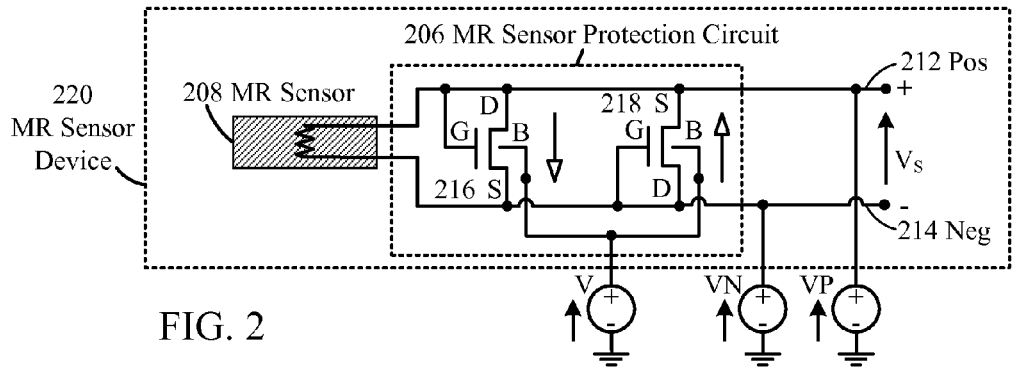
FIG. 2 is a schematic representation of an MR sensor protection circuit including two NFETs, according to embodiments.

FIG. 2 is a schematic representation of a MR sensor device 220 including an MR sensor protection circuit 206, which includes two n-channel field-effect transistors (NFETs), 216 and 218, and is coupled to MR sensor 208, according to embodiments generally consistent with MR sensor device 120 (FIG. 1). MR sensor protection circuit 206 may be generally used as a protection device for MR sensor 208, to shield it from damage due to ESD events. MR sensor protection circuit 206 may be particularly useful in ensuring the reliability of a data storage device that employs MR sensors, such as a magnetic tape drive or hard disk drive. MR sensor protection circuit 206 may be useful in preventing costly failures and repairs of a data storage device. MR sensor 208 and MR sensor protection circuit 206 may be also connected, through positive terminal 212 and negative terminal 214, to a read channel, consistent with FIG. 1. MR sensor 208 is consistent in structure, interconnection and function with MR sensor 108, as described and illustrated in FIG. 1. The two NFETs 216 and 218 are similar to NFETs depicted in MR sensor protection circuit 106.

The NFETs 216 and 218 may be particularly useful in protecting MR sensor 208 from damage from both positive and negative types of ESD events. The first NFET 216 may be coupled to the positive terminal 212 and to the negative terminal 214, and may be configured to, in response to a voltage $V_S$ between terminals 212 and 214 being within the positive protection threshold voltage range, limit the voltage by shunting current from the positive terminal 212 to the negative terminal 214. A positive ESD event may include a positive voltage difference between terminal 212 and terminal 214 that is within a positive protection threshold range. The first NFET 216 may have a gate (G) and a drain (D) coupled to the positive terminal 212, a source (S) coupled to the negative terminal 214, and a substrate (body) terminal (B) coupled to the voltage source (V).

The second NFET 218 may be coupled to the positive terminal 212 and to the negative terminal 214, and may be configured to, in response to a voltage $V_S$ between terminals 212 and 214 being within the negative protection threshold voltage range, limit the voltage by shunting current from the negative terminal 214 to the positive terminal 212. A negative ESD event may include a negative voltage difference between terminal 212 and terminal 214 that is within a negative protection threshold range. The second NFET 218 may have a gate (G) and a drain (D) coupled to the negative terminal 214, a source (S) coupled to the positive terminal 212, and a substrate (body) terminal (B) coupled to the voltage source (V).

Voltage sources V, VP and VN may be coupled to MR sensor device 220 and may provide a reference voltage and an operating supply voltage to the MR sensor 208, and the MR sensor protection circuit 206. The differential voltage $V_S$, between VP and VN may provide a specified bias level to the MR sensor 208 during functional operation. Voltage source VN may supply a bias voltage to the negative terminal 214 of the MR sensor protection circuit 206, and voltage source V may be used to bias the body of the MR protection circuit 206.

FETs 216 and 218 may be useful in providing the MR sensor 208 protection from both positive and negative ESD events in both positive and negative protection threshold voltage ranges specifically suited to the MR sensor 208.

In the absence of an ESD event, the voltage between the terminals 212 and 214 may remain less than or equal to a maximum normal operating voltage (e.g. 0.2 V) of the MR sensor 208. NFET 216 may be designed with a threshold voltage ($V_T$) corresponding to a positive protection threshold voltage of MR sensor protection circuit 206. The $V_T$ of NFET 216 may be greater than the maximum normal operating voltage, (e.g. 0.2 V) of MR sensor 208, but less than an MR sensor's 208 maximum safe operating voltage (e.g. 0.5 V). If the voltage between the terminals 212 and 214 remains less than or equal to MR sensor protection circuit's 206 positive protection threshold voltage (e.g. 0.3 V), then the voltage between the gate (G) and source (S) of the NFET 216 may not exceed its threshold voltage, $V_T$, (e.g., 0.3 V), and the NFET 216 may remain in an "off" state, not conducting significant current between its source (S) and drain (D) terminals. A small amount of leakage current (e.g., less than 2 μA) may flow between the source (S) and drain (D) terminals of the NFET 216 while in an off state. Consistent with embodiments, the design and manufacturing parameters can be chosen to limit this current, so that it does not limit the operation of the MR sensor 208.

The voltage $V_S$ between the terminals 212 and 214 may increase in response to a positive ESD event, to a level greater than or equal to a positive protection threshold voltage of the MR sensor protection circuit 206. When the voltage between the terminals 212 and 214, corresponding to the voltage between the gate (G) and source (S) of the NFET 216, exceeds the NFET's 216 threshold voltage, $V_T$, (e.g. 0.3 V), then the NFET 216 may transition to an "on" state, and shunt current (e.g., 100 mA) between its source (S) and drain (D) terminals. The shunt current which may flow through NFET 216 may be effective in limiting the voltage between the positive terminal 212 and the negative terminal 214 to a value within an MR sensor's 208 positive safe operating voltage range.

NFET 218 may be configured and designed to operate in a manner similar, but complimentary to NFET 216, in response to negative ESD events where the negative voltage between terminal 212 and terminal 214 exceeds a negative protection threshold voltage. NFET 218 may be designed and configured to shunt current from negative terminal 214 to positive terminal 212, and thereby limit negative the voltage between terminal 212 and terminal 214 to within the negative safe operating voltage range.

NFETs 216 and 218 may be fabricated on the same IC, may have consistent manufacturing process parameters, and may share a common substrate (body) terminal, as a result of being the same (N) type. NFET 218 may be designed to have electrical characteristics different from those of NFET 216, in order to be suitable for a protection threshold voltage range different than that of NFET 216. The body (B) terminals of NFET 216 and NFET 218 may be both coupled to a bias voltage source (V). Embodiments may also include the body (B) of each NFET device coupled to the positive terminal 212, the negative terminal 214, or other bias voltage sources.

In addition to the ESD event protection provided by the two NFETs, a parasitic p-type body to n-type drain diode of either NFET 216 or NFET 218 may turn on when the voltage across terminals 212 and 214 exceeds the diode's threshold voltage, $V_T$, (e.g., 0.7 V). This diode may shunt current, in addition to the current shunted by FETs 216, 218, which may enhance the overall ESD protection of MR sensor protection circuit 206.

The physical and electrical properties of an MR sensor may cause the sensor to have increased performance when used in a particular polarity configuration (of voltage across its terminals). For example, an MR sensor may exhibit a greater sensitivity to applied magnetic fields (in the form of a larger change of resistance) when configured with a positive voltage across its terminals, than when configured with a negative voltage across its terminals. As a result, a designer may choose to employ an MR sensor in a preferred polarity configuration.

In a preferred polarity configuration, an MR sensor may have positive and negative voltage ranges that differ from each other. For example, an MR sensor's normal operating voltage range may be between 0.0 V and +0.2 V, entirely within a range of positive voltages, and the sensor may not have a normal negative operating voltage range. Similarly, the sensor's positive safe operating voltage range may be different than its negative safe operating voltage range, as a result of the sensor's unique vulnerabilities to positive and negative ESD events.

A particular MR sensor's preferred polarity configuration, (DC) normal operating voltage, and asymmetric normal and safe operating voltage ranges, may be considered by a designer in specifying parameters for a robust MR sensor protection circuit. The DC operating voltage present across the terminals of an MR sensor may, for example, make the sensor more susceptible to positive ESD events. As a result, in order to ensure robust protection against positive ESD events, NFET 216 may have a lower specified $V_T$ than NFET 218.

The first NFET 216 may have off-state leakage characteristics and a threshold voltage, $V_T$, resulting from a set of specified design and manufacturing process parameters. The second NFET 218 may have different off-state leakage characteristics and a $V_T$, resulting from a different set of specified design and manufacturing process parameters. Such parameters may include, but are not limited to, transistor geometries, semiconductor doping profiles, and bias voltages.

Various embodiments allow for the consideration of possible trade-offs between MR sensor protection circuit sensitivity, and leakage current, which may interfere with the operation of the MR sensor. Specifying a relatively low FET $V_T$, for example, may result in an MR sensor protection circuit that is very responsive to ESD events, however, may also result in leakage current levels that may interfere with the MR sensor's read operations. Specifying a relatively high $V_T$ may result in an MR sensor protection circuit having leakage current levels that may not interfere with the MR sensor's read operations, however, the protection circuit may be insufficiently responsive to protect the MR sensor from ESD events.

The $V_T$ and leakage characteristics of each NFET may be designed and specified to be compatible with a particular positive or negative protection threshold voltage range. The magnitude of the positive threshold voltage range may be different than the magnitude of the negative threshold voltage range, and may result from discussed asymmetric MR sensor electrical characteristics and operating voltages.

Consistent with embodiments, the FET parameters, such as FET doping profiles, transistor dimensions, such as width and gate length, and substrate (body) bias voltages can be varied in order to obtain FET characteristics (e.g., $V_T$ and leakage current) suitable for a particular application.

For example, voltage (V) may be used to bias the NFETs 216 and 218, in order to modify the $V_T$, and/or limit the off-state leakage current between the source (S) and drain (D) terminals of the NFETs. In embodiments, the body terminals (B) of the NFETs 216 and 218 may be connected to the voltage (V), which may be lower than the minimum operating voltage on the negative terminal 214.

Coupling the body terminals of the NFETs 216 and 218 to a voltage below the lowest voltage of the NFET's source (S) and drain (D) terminals may be useful in reducing off-state leakage current of the NFETs. Voltage (V) may be specified to be within a range between the voltage of the negative terminal 214, and VDD volts below the voltage of the negative terminal 214. VDD may be the specified supply voltage for NFETs 216 and 218. By limiting voltage (V) to this range, damage to the NFETs resulting from dielectric breakdown of the NFET's gate oxide layer may be avoided.

According to embodiments of the present disclosure, the MR sensor protection circuit 206 may provide for high-reliability reading of data stored at high density on a magnetic medium, for a computer or other electronic system, by preventing potentially destructive voltage levels from reaching the terminals of an MR sensor. Limiting the voltage across the terminals of an MR sensor may preserve its physical and electrical integrity, enabling it to function reliably. The MR sensor protection circuit 206, in MR sensor device 220, may be designed to be compatible with a variety of MR sensor types, and may be useful in protecting various MR sensors while not limiting their performance. Embodiments of the present disclosure may be implemented in various IC technologies, and packaged on a ceramic or ferrite substrate, a flex cable, or on a hard disk drive read arm, consistent with available IC and electronic packaging technologies.

Figure 3:
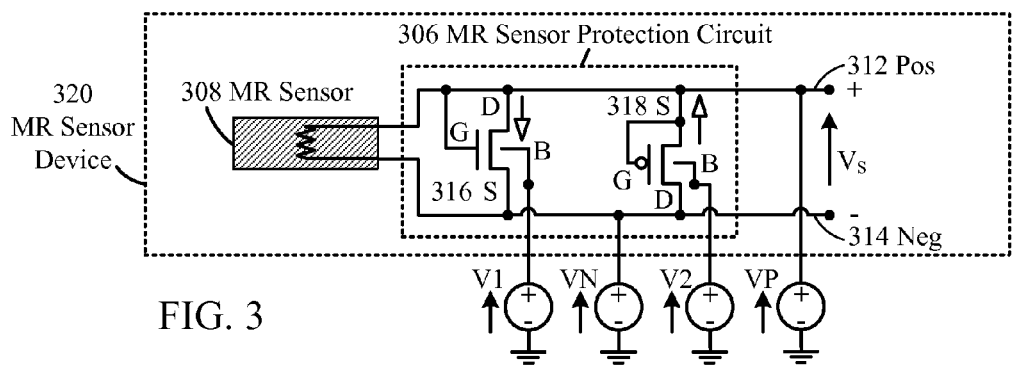
FIG. 3 is a schematic representation of an MR sensor protection circuit including an NFET and a p-channel field-effect transistor (PFET), according to embodiments.

FIG. 3 is a schematic representation of a MR sensor device 320 including an MR sensor protection circuit 306, which includes an NFET 316 and a PFET 318, and is coupled to MR sensor 308, according to embodiments similar in structure, interconnection and function to MR sensor device 220 (FIG. 2).

NFET 316 is functionally consistent with NFET 216, depicted in MR sensor protection circuit 206. NFET 316 may have a gate (G) and a drain (D) coupled to the positive terminal 312, a source (S) coupled to the negative terminal 314. NFET 316 may also have a substrate (body) terminal (B) coupled to the voltage source (V1). The PFET 318 is functionally consistent with NFET 218 (FIG. 2), and may have a gate (G) and a source (S) coupled to the positive terminal 312, a drain (D) coupled to the negative terminal 314, and a substrate (body) terminal (B) coupled to the voltage source (V2).

Both the independent bias voltages V1 and V2, and differing design/manufacturing parameters of NFET 316 and PFET 318 may be useful in adapting characteristics of the FETs (e.g., $V_T$ and leakage current levels) to be suitable for providing independent positive and negative levels of ESD protection for an MR sensor. According to embodiments, parameters, such as FET doping profiles, transistor dimensions (e.g., width and gate length), and substrate (body) bias voltages, can be varied in order to obtain FET characteristics (e.g., $V_T$ and leakage current) suitable for a particular ESD protection application.

Voltage source VN may provide a specified bias level for the negative terminal 314 of the MR sensor 308, and may be used as a supply voltage for MR sensor device 320 and for circuits connected to or related to MR sensors, for example, a read channel.

NFET 316 and PFET 318 may be fabricated on the same IC, may have consistent manufacturing process parameters, and may have separate substrate (body) terminals, as a result of being the different (N and P) types. The body (B) terminals of NFET 316 and PFET 318 may be coupled to separate bias voltage sources (V1 and V2, respectively), to the positive terminal 312, the negative terminal 314, or other bias voltage sources.

Voltage V1 may be used to bias the NFET 316, in order to modify the $V_T$, and/or limit the off-state leakage current between the source (S) and drain (D) terminals of the NFET. In embodiments, the body terminal (B) of the NFET 316 may be connected to the voltage V1, which may be lower than the minimum operating voltage on the negative terminal 314.

Voltage (V2) may be used to similarly bias the PFET 318. In embodiments, the body terminal (B) of the PFET 318 may be connected to the voltage (V2), which may be higher than the maximum operating voltage on the positive terminal 312. Coupling the body terminal of the PFET 318 to a voltage above the highest voltage of the PFET's 318 source (S) and drain (D) terminals may be useful in reducing off-state leakage current of the PFET. Voltage (V2) may be specified to be within a range between the voltage of the positive terminal 312, and VDD volts above the voltage of the positive terminal 312. VDD may be the specified supply voltage for PFET 318. By limiting voltage (V) to this range, damage to the PFET resulting from dielectric breakdown of the PFET's 318 gate oxide layer may be avoided.

Figure 4:
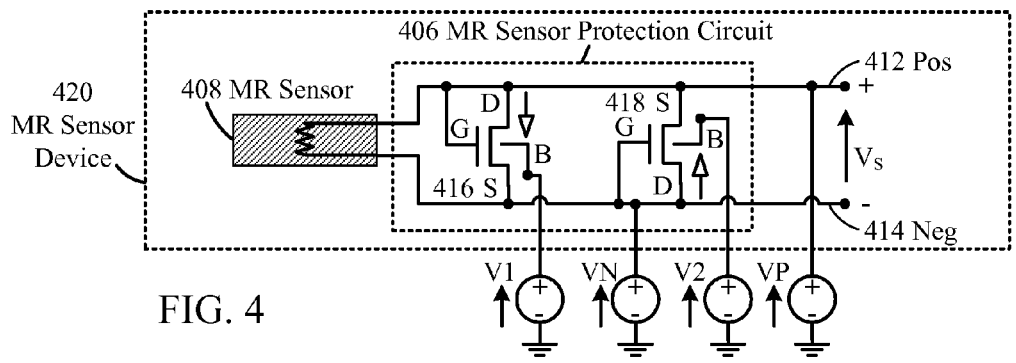
FIG. 4 is a schematic representation of an MR sensor protection circuit including two symmetrical NFETs, according to embodiments.

FIG. 4 is a schematic representation of a MR sensor device 420 including an MR sensor protection circuit 406, which may include two symmetrical NFETs 416 and 418, and which is coupled to MR sensor 408, according to embodiments generally consistent with MR sensor device 220 (FIG. 2). MR sensor protection circuit 406 may be generally used as a protection device for MR sensor 408, to shield it from damage due to ESD events. MR sensor protection circuit 406 may be consistent in function and application with MR sensor protection circuit 206 (FIG. 2). MR sensor 408 and MR sensor protection circuit 406 may be also connected, through positive terminal 412 and negative terminal 414, to a read channel, consistent with FIG. 1. MR sensor 408 is consistent in structure, interconnection and function with MR sensor 208 (FIG. 2).

NFETs 416 and 418 may be functionally similar to NFETs 216 and 218, respectively, as depicted in FIG. 2, and may be fabricated on an IC using triple-well or silicon-on-insulator (SOI) technology, and as a result, may have substrates (bodies) that are electrically isolated from each other. NFET 416 may have a gate (G) and a drain (D) coupled to the positive terminal 412, a source (S) coupled to the negative terminal 414. NFET 416 may also have a substrate (body) terminal (B) coupled to the voltage source (V1). NFET 418 may have a gate (G) and a drain (D) coupled to the negative terminal 414, a source (S) coupled to the positive terminal 412, consistent with NFET 218 (FIG. 2). NFET 418 may also have a substrate (body) terminal (B) coupled to the voltage source (V2).

The independent voltage sources V1 and V2 may allow separate bias voltages to be applied to the body (B) terminals of NFETs 416 and 418, respectively. Independent biasing of NFETs 416 and 418 may be useful in tuning characteristics of the NFETs to be suitable for providing positive and negative ESD protection for an MR sensor. The ability to independently bias the body (B) terminals of NFETs 416, 418 may be useful in adjusting their performance characteristics to match differing positive and negative ESD protection needs of an MR sensor.

Voltage source VN may provide a specified bias level for the negative terminal 414 of the MR sensor 408, and may be used as a supply voltage for MR sensor device 420 and for circuits connected to or related to MR sensors, for example, a read channel.

NFETs 416 and 418 may be fabricated on the same IC, may have consistent manufacturing process parameters, and may have separate substrate (body) terminals, as a result of being fabricated using triple-well or silicon-on-insulator (SOI) technology. Embodiments may also include the coupling of the body (B) of each FET device to the positive terminal 412, the negative terminal 414, or other bias voltage sources.

Voltage (V1) may be used to bias the NFET 416, in order to modify the $V_T$, and/or limit the off-state leakage current between its source (S) and drain (D) terminals. In embodiments, voltages V1 and V2 may be lower than the minimum operating voltage on the negative terminal 414. Voltage (V2) may be used to similarly bias the NFET 418. Coupling the body terminal of the NFETs 416 and 418 to a voltage below the lowest voltage of the NFETs source (S) and drain (D) terminals may be useful in reducing off-state leakage current of the NFETs. Voltages V1 and V2 may be specified to be within a range between the voltage of the negative terminal 414, and VDD volts below the voltage of the negative terminal 412. VDD may be the specified supply voltage for NFETs 416 and 418. By limiting voltages V1 and V2 to this range, damage to the NFET resulting from dielectric breakdown of the NFETs gate oxide layer may be avoided.

According to embodiments of the present disclosure, the MR sensor protection circuit 406 may provide for high-reliability reading of data stored at high density on a magnetic medium, for a computer or other electronic system, by preventing potentially destructive voltage levels from reaching the terminals of an MR sensor.

NFETs 416 and 418 may represent FETs which are manufactured on the same IC, but do not share a common substrate (body) terminal, as a result of the IC being a silicon-on-insulator (SOI) type, or having a triple well structure.

Figure 5:
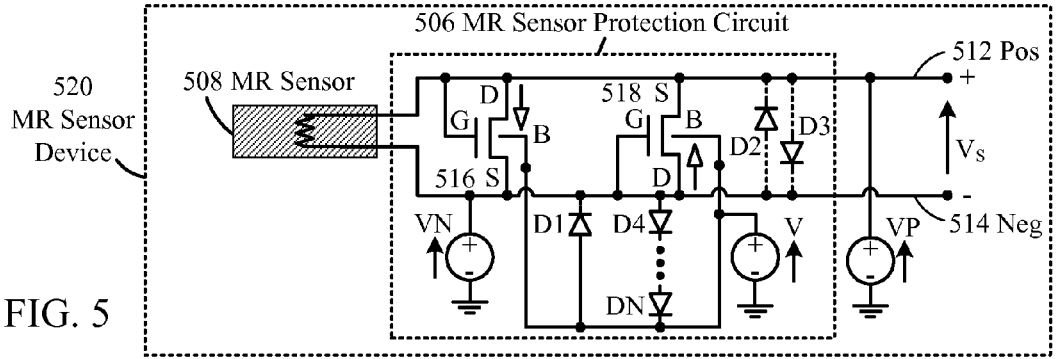
FIG. 5 is a schematic representation of an MR sensor protection circuit including two n-channel field-effect transistors (NFETs) and bipolar PN diode structures, according to embodiments.

FIG. 5 is a schematic representation of a MR sensor device 520 including an MR sensor protection circuit 506, which includes NFETs 516 and 518 and PN diode structures, and is coupled to MR sensor 508. MR sensor protection circuit 506 may be similar in function and application with MR sensor protection circuit 206. MR sensor 508 is similar in structure, interconnection and function with MR sensor 208, as described and illustrated in FIG. 2. Voltage sources V and VN are consistent in interconnection, function, and purpose with voltage sources V and VN (FIG. 2).

PN diode D1 is coupled in a reverse-biased orientation from the negative terminal 514 to the body (substrate) terminals of NFETs 516 and 518. A series-coupled string of PN diodes (represented by diodes D4 . . . DN) is also coupled in a forward-biased orientation from the negative terminal 514 to the body (substrate) terminals of NFETs 516 and 518. PN diode D1 and the series-coupled string of PN diodes may be useful in reducing a voltage difference between V and VN that is outside the reliable operating range of the NFETs (e.g., by shunting additional current). Diode D1 and the series-coupled diode string may be useful to provide ESD protection to the FETs 516 and 518 during the wafer fabrication process and during the assembly operations.

The number of diodes in the series-coupled PN diode string may be chosen in order to limit the current shunted through them during normal MR sensor read operations, and not limit the performance of the MR sensor. NFETs 516 and 518 may represent FETs which share a common substrate (body) terminal, consistent with FIG. 2. Some embodiments may include diodes D2, D3, coupled to the positive terminal 512 and to the negative terminal 514, which may be useful in protecting NFETs 516 and 518 from ESD events during the fabrication or assembly processes.

According to embodiments of the present disclosure, the MR sensor protection circuit 506 may provide for high-reliability reading of data stored at high density on a magnetic medium, for a computer or other electronic system, by preventing potentially destructive voltage levels from reaching the terminals of an MR sensor.

The figures depict various configurations of FETs employed as ESD protection devices, however these depictions do not limit the present disclosure. Other embodiments, for example, may include additional quantities and types of MR sensor protection devices, which may be coupled between an MR sensor's positive and negative terminals. For example, protection devices including but not limited to PN diodes, Schottky diodes, dissipative shunt devices (resistors), and FETs with a variety of $V_T$ and leakage characteristics may be used. NFETs and PFETs may both be used in a variety of configurations, to protect an MR sensor against both positive and negative ESD events.

These types of devices may provide a more robust protection solution within various voltage ranges corresponding to various MR sensor failure modes. The voltage range may be, for example, above +/−1.0 V. Additional protection devices may increase the amount of current that an MR sensor protection circuit may shunt, and thereby increase its level of protection for an MR sensor. Additional protection devices may be coupled to provide current shunting between MR sensor terminals, or alternatively, from one or both terminals to a ground.

Various embodiments are based upon the effects of additional capacitance and other electrical parasitics that additional protection devices may add to the terminals of an MR sensor (which can be analyzed and/or simulated using electrical circuit simulation software). Additional electrical parasitics, such as capacitance, may limit bandwidth of the MR sensor during a read operation.

Figure 6:
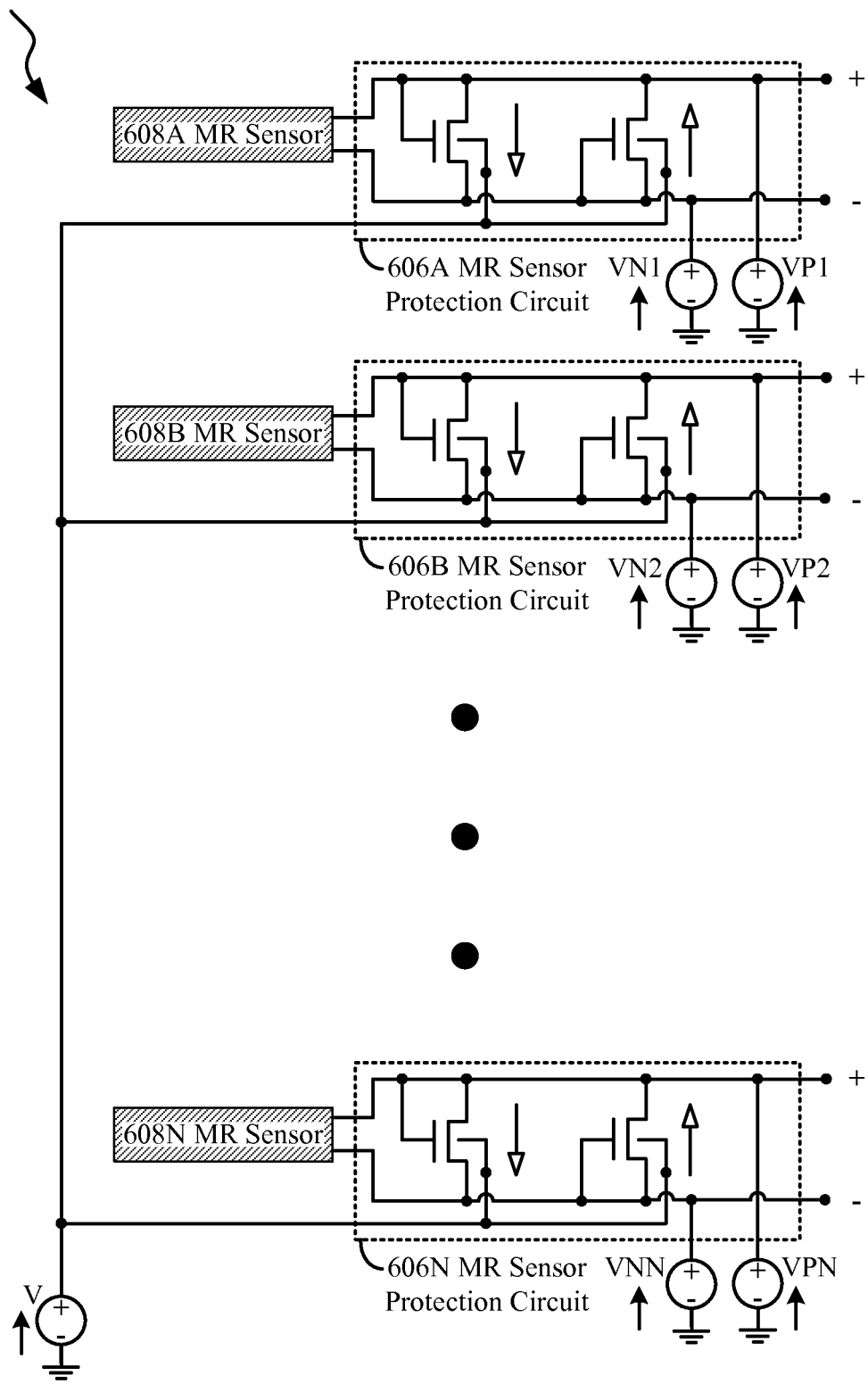
FIG. 6 is a schematic representation of a plurality of MR sensors and MR sensor protection circuits that have a common NFET body voltage node, according to embodiments.

FIG. 6 is a schematic representation of a plurality of MR sensors (608A, 608B . . . 608N) and MR sensor protection circuits (606A, 606B . . . 606N), having a common NFET body voltage node coupled to a voltage source (V), according to embodiments. Each MR sensor protection circuit (606A, 606B . . . 606N) is consistent with MR sensor protection circuit 206 (FIG. 2), and each has an independent supply voltage source (VN1, VN2 . . . VNN). Other embodiments allow for MR sensor protection circuits consistent with embodiments discussed herein, such as embodiments consistent with one or more of FIGS. 3-5.

The configuration depicted in FIG. 6 may be useful in applications which may employ a plurality (array) of MR sensors to read multiple tracks of data from a single magnetic medium, such as magnetic tape. Embodiments are directed toward the selection a voltage (V) that is suitable for a number of MR sensor protection circuit supply voltage sources (VN1, VN2 . . . VNN), which may have a range of output voltages.

According to embodiments of the present disclosure, the MR sensor protection circuits (606A, 606B . . . 606N) may provide for high-reliability reading of multiple tracks of data stored at high density on a magnetic medium, such as magnetic tape, for a computer or other electronic system, by preventing potentially destructive voltage levels from reaching the terminals of multiple MR sensors.

Figure 7:
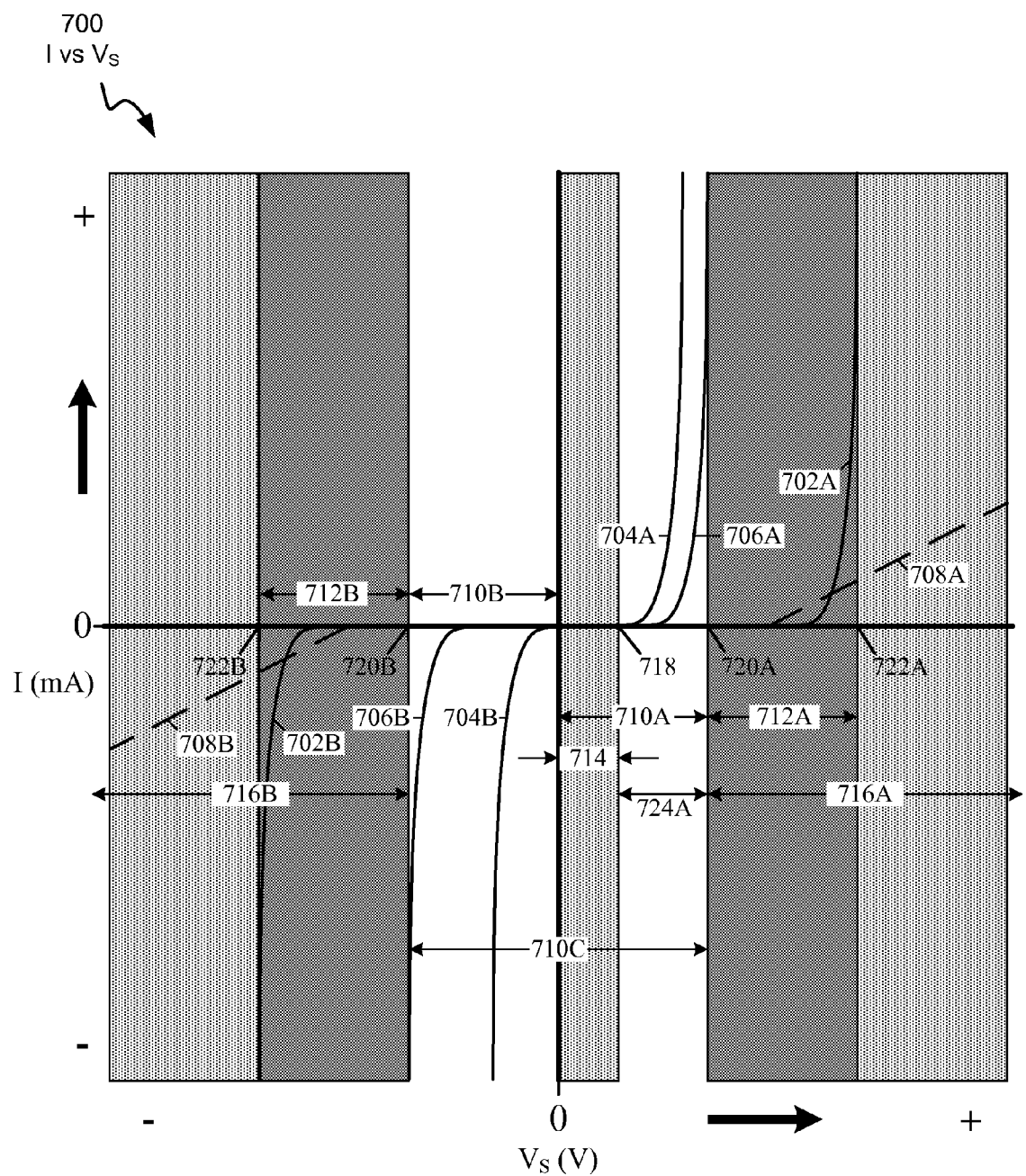
FIG. 7 is a graph of sensor voltage ($V_S$) plotted against MR sensor protection circuit current (I), according to embodiments.

FIG. 7 is a graph which includes the voltage $V_S$ across the terminals of an MR sensor, plotted against a corresponding MR sensor protection device shunt current (I), for various MR sensor protection devices, according to embodiments. An MR sensor protection device may be a discrete electronic component such as a PN diode, an NFET, a PFET, or a dissipative shunt (resistor). An MR sensor protection circuit may generally be constructed using two or more MR sensor protection devices, configured in parallel, to provide protection from both positive and negative ESD events.

The graph 700 also depicts voltages and voltage ranges pertaining to MR sensors and MR sensor protection circuits of the present disclosure. The X-axis corresponds to the voltage ($V_S$) between a positive terminal and a negative terminal of an MR sensor. A positive voltage ($V_S$) depicted on the graph corresponds to the voltage on the positive terminal being greater than the voltage on the negative terminal. The Y-axis corresponds to the shunt current (I) that may flow through an MR sensor protection device connected between the positive terminal and the negative terminal of the MR sensor. A positive current (I) depicted on the graph corresponds to current flowing from the positive terminal, through the MR sensor protection circuit, to the negative terminal. The graph 700 may illustrate concepts and general principles relating to MR sensor protection circuits and devices, and may not necessarily be drawn to scale, and is not limiting Voltage range 714 represents a normal operating voltage range for an MR sensor, and is bounded by a maximum normal operating voltage 718, and 0 V, in this example. Voltage range 714 may encompass a range of voltages that may result from a normal range of operating currents being driven through an MR sensor, for example, by a read channel. The maximum normal operating voltage 718 may be, for example, 0.2 V, for a particular application. Voltage range 714 may not necessarily be symmetrical around 0 V, due to the physical and electrical properties of the MR sensor.

Voltage range 710C represents a safe operating voltage range, within which the MR sensor may be operated without incurring physical or electrical damage. A safe operating voltage range may be specified by a MR sensor manufacturer. Range 710C includes a positive safe operating voltage range 710A, and a negative safe operating voltage range 710B. Range 710A is bounded by a maximum positive safe operating voltage 720A, and 0 V, in this example, and range 710B is bounded by a maximum negative normal operating voltage 720B, and 0 V. An MR sensor may be reliably operated at a voltage range (710C) between voltage 720B and 720A without incurring physical or electrical damage. A maximum positive safe operating voltage 720A may be, for example, 0.5 V, for a particular application. Operation of an MR sensor above the maximum positive safe operating voltage 720A may result in damage to the sensor. The voltage level at which sensor damage may occur may depend on the duration of the applied voltage. For example, for a positive $V_S$, an MR sensor may be damaged at a certain voltage level (e.g., 0.6V) by a pulse of 5 nS, but may not sustain damage at that voltage by a shorter pulse (e.g., 1 nS). The positive safe operating voltage 720A may be specified to be the maximum voltage safe voltage at which an MR sensor may be operated at, over an anticipated range of ESD event voltages and durations. The normal operating voltage range 714 may be within the safe operating voltage range 710C.

Voltage range 724A represents a positive protection threshold voltage range, corresponding to positive ESD events, within which an MR sensor protection circuit may be activated in order to shunt current between the terminals of MR sensor, and thus limit the voltage between them, without either limiting the sensor's performance, or exposing it to potential damage due to an ESD event. Similarly, voltage range 710B represents a negative protection threshold voltage range, corresponding to negative ESD events.

Voltage range 724A may be a range of positive voltages between the maximum positive normal operating voltage 718, and the maximum positive safe operating voltage, 720A. Similarly, voltage range 710B may be a range of negative voltages between the maximum negative normal operating voltage (0 V, in this example), and the maximum negative safe operating voltage, 720B.

Curves 704A and 706A represent characteristics of FETs configured with a threshold voltage $V_T$ within the positive protection threshold voltage range 724A. Similarly, curves 704B and 706B represent characteristics of FETs configured with a threshold voltage $V_T$ within a negative protection threshold voltage range 710B. Curves 704A and 706A (similarly 704B and 706B) illustrate possible changes in FET performance resulting from tuning of the FET's $V_T$, by adjusting parameters such as substrate bias voltages, transistor geometries, and FET doping profiles. The parameters of FET devices (illustrated by the relative location of their curves, e.g., 704A and 706A) can be adjusted to balance the needs of low leakage currents during MR sensor operation, against robust current shunting capability during an ESD event. Leakage currents through a FET device used to protect an MR sensor circuit, during normal operation, may be designed to be significantly lower than FET on-state shunting currents. For example, leakage currents may be one or more orders of magnitude (e.g., 10 to 1,000,000 times) lower than on-state shunting currents.

Curve 708A represents the voltage-current characteristics of a relatively high impedance MR sensor protection device, such as a Schottky diode, configured to protect the MR sensor from positive ESD events. The slope of curve 708A represents the device's resistance while in an on-state. Similarly, curve 708B represents a relatively high impedance MR sensor protection device configured to protect the MR sensor from negative ESD events. The intersection of the curve with the X-axis may represent a threshold voltage ($V_T$), in the case where the curve represents a diode or FET. For example, a PN diode may have an intersection ($V_T$) at about 1.0 V.

The voltage across the diode-connected FET or a diode in the on-state may be expressed by the (simplified) equation:

$$V_{ON} = V_T + I_{BIAS} \times R_{ON}$$

Where:
$I_{BIAS}$ is the current through the diode/FET
$V_T$ is the threshold voltage of the diode/FET
$R_{ON}$ is the series resistance of the diode For voltages below $V_T$, the currents through the diode/FET are negligible from an ESD protection perspective and are considered "leakage" currents. Similarly, curves 702A and 702B represent diodes for FET devices with a threshold voltage outside of safe operating voltage range 710C of the MR sensor. A plot of the voltage-current characteristics of a dissipative shunt, due to its high resistance, may be similar to the X-axis of the graph 700.

Voltage 722A may represents a minimum positive voltage at which a particular protection circuit (such as a PN diode) may activate to protect MR sensor. Voltage region 712A may represent a positive voltage range in which an MR sensor may remain unprotected (i.e., outside of a safe operating voltage range, but not inside the range of protection of a device such as a PN diode). Similarly, voltage 722B may represents a minimum negative voltage at which a particular protection circuit (such as a PN diode) may activate to protect MR sensor, and voltage region 712B may represent a negative voltage range in which an MR sensor may remain unprotected.

Voltage ranges 716A and 716B represent positive and negative voltage ranges, outside of a safe operating voltage range 710C, at which an MR sensor may be damaged, (in the absence of an MR sensor protection circuit). Ranges 716A and 716B may have no upper or lower bounds, respectively.

Figure 8:
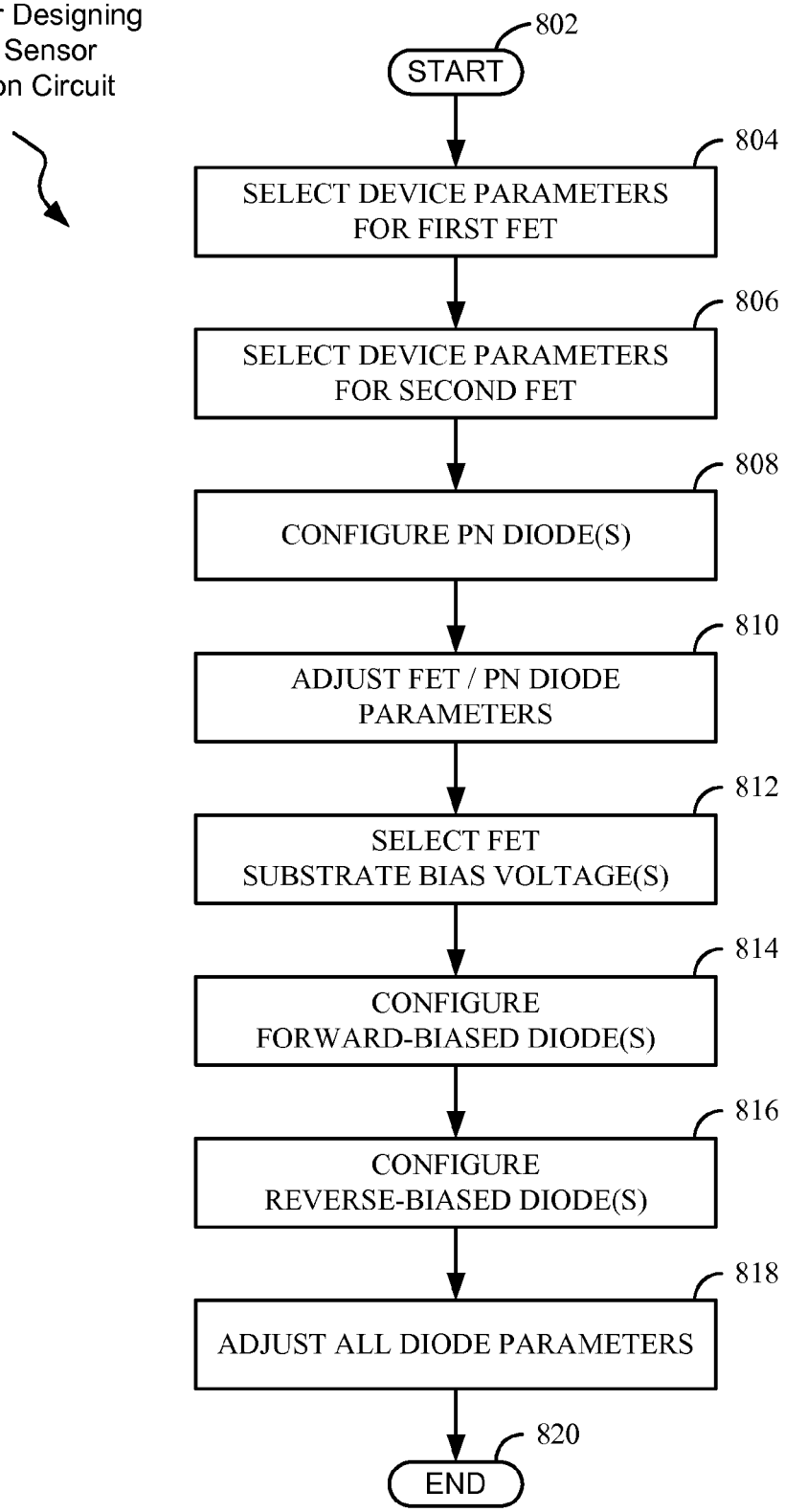
FIG. 8 is a flow diagram illustrating a method for designing an MR sensor protection circuit, according to embodiments.

FIG. 8 is a flow diagram illustrating a method for designing an MR sensor protection circuit, according to embodiments. The process 800 moves from start 802 to operation 804. Operation 804 generally refers to selecting FET parameters for the first FET, which may be used to protect the MR sensor by shunting current from the positive terminal to the negative terminal, as depicted, for example in 216 (FIG. 2). FET parameters may include threshold voltage ($V_T$), gate length (L), gate width (W), a specified supply voltage (VDD), leakage current when the FET is in an off-state ($I_{OFF}$), and FET doping profiles. The FET parameters may be chosen by a designer in order to limit the leakage and displacement currents of the first FET to a level that does not interfere with the performance of the MR sensor, in the absence of an ESD event, under normal operating conditions. Normal operating conditions may include, for example, holding the body of the NFET at a voltage in a range between the lowest voltage terminal (source or drain) of the NFET, and VDD volts below the lowest voltage terminal.

The FET parameters may also be chosen by a designer to enable the FET to shunt sufficient current away from the MR sensor, in order to protect it during an ESD event where the voltage of the positive terminal is greater than the voltage of the negative terminal. Once FET parameters are selected for the first FET the process moves to operation 806.

Operation 806 generally refers to selecting FET parameters for the second FET, which may be used to protect the MR sensor by shunting current from the negative terminal to the positive terminal, as depicted, for example in 218 (FIG. 2). FET parameters may be consistent with those chosen in operation 804. In addition to the criteria used to choose FET parameters in operation 804, the parameters may also be chosen to ensure the second FET is reliable under operating conditions defined for the first FET, and to enable the second FET to shunt sufficient current away from the MR sensor in order to protect it during an ESD event where the voltage of the negative terminal is greater than the voltage of the positive terminal. Once FET parameters are selected for the second FET, the process moves to operation 808.

Operation 808 generally refers to configuring a forward-biased PN diode and a reverse-biased PN diode between the positive terminal and the negative terminal of the MR sensor. These diodes may be useful to extend or enhance the ESD event voltage protection range provided by the first and second FETs, and to protect the FETs during wafer processing. Additional PN diodes may enable additional current to be shunted at higher ($V_S$) voltages. Once the forward-biased PN diode and a reverse-biased PN diode are configured, the process moves to operation 810.

Operation 810 generally refers to specifying (or adjusting) the parameters such as widths of the FETs and of the diodes. A designer may specify the widths of the FETs and the PN diodes in order to limit both the parasitic capacitance and the leakage currents of these devices to values which do not limit the performance (bandwidth and sensitivity) of the MR sensor, while providing robust clamping current to protect MR sensor from ESD events. A designer may compare designs including PN diodes and FETs to designs using only FETs. A design may be chosen based on factors such as a specified ESD performance level, physical size of the circuit, implementation cost, or expected leakage or parasitic capacitance values. Once the parameters (widths) of the FETs and the widths of the diodes are specified the process moves to operation 812.

Operation 812 generally refers to selecting a FET substrate (body) bias voltage. A designer may choose a FET substrate bias voltage based upon the operating voltages of the MR sensor, and VDD that the FET is designed for. A FET substrate bias voltage may be in a range between the operating voltage of the negative terminal of the MR sensor and VDD volts below the negative terminal. The FET substrate bias voltage may be chosen to limit the current leakage the FETs to a level that does not interfere with the performance of the MR sensor. Embodiments may use one or more FET substrate bias voltages. Once a FET substrate bias voltage is selected, the process moves to operation 814.

Operation 814 generally refers to configuring a string of diodes in a forward-biased orientation from the negative terminal of the MR sensor to the substrate of the NFETs in the MR sensor protection circuit. A designer may specify the number of diodes to limit the maximum voltage drop across the negative terminal and the NFET substrate, so as to limit the leakage current between the negative terminal the substrate so it does not degrade the performance of the MR sensor. The string of forward-biased diodes may be useful in protecting the FETs from ESD events during manufacturing and during assembly operations. The diodes may generally be fabricated on the same IC as the NFETs of the MR sensor protection circuit, in order to limit parasitic capacitance, size of the MR sensor protection circuit, and assembly complexity. Once a string of forward-biased diodes is configured the process moves to operation 816.

Operation 816 generally refers to connecting a diode in a reverse-biased configuration from the negative terminal of the MR sensor to the substrate of the NFETs in the MR sensor protection circuit. The reverse-biased diode may be useful in protecting the FETs from ESD events during manufacturing and during assembly operations. Once a reverse-biased diode is configured the process moves to operation 818.

Operation 818 generally refers to specifying or adjusting the widths of the diodes connected in operations 814 and 816. A designer may specify the diode widths based on available integrated circuit (IC) area, and parasitics (leakage currents and capacitance) resulting from diodes of a particular size. Once the widths of the diodes connected in operations 814 and 816 are specified or adjusted, the process 800 may end at block 820.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:
1. A method of designing, for a magneto-resistive (MR) sensor, a protection circuit having a first N-channel field-effect transistor (NFET), a second NFET and at least one positive-negative (PN) diode, the method comprising:
   determining a safe operating voltage range for the MR sensor;
   determining, within the safe operating voltage range, a normal operating voltage range for the MR sensor;
   determining a protection threshold voltage range that is outside of the normal operating voltage range for the MR sensor and within the safe operating voltage range of the MR sensor; and
   selecting device parameters to configure the first NFET, the second NFET and the at least one PN diode to, in response to a voltage between a positive terminal and a negative terminal of the MR sensor being within a protection threshold voltage range, limit, by shunting current, the voltage between the positive terminal and the negative terminal.

2. The method of claim 1, wherein determining a safe operating voltage range and a normal operating voltage range for the MR sensor further comprises receiving, from a manufacturer of the MR sensor, a specified safe operating voltage range and a specified normal operating voltage range.

3. The method of claim 1, wherein determining the protection threshold voltage range includes determining a positive protection threshold voltage range and determining a negative protection threshold voltage range.

4. The method of claim 1, wherein selecting device parameters to configure the first NFET and the second NFET further comprises selecting, for each NFET, at least one parameter of a group of parameters consisting of: a threshold voltage, a gate length, a gate width, an off-state leakage current, and a NFET doping profile.

5. The method of claim 1, wherein selecting device parameters to configure the at least one PN diode further comprises selecting, for each diode of the at least one diode, at least one parameter of a group of parameters consisting of: a threshold voltage, a width, an off-state leakage current, and a doping profile.

6. The method of claim 1, wherein device parameters for the first NFET and for the second NFET are selected to limit, under normal operating conditions, leakage and displacement currents of the first NFET and of the second NFET, respectively.

7. A method for designing a protection circuit for a magneto-resistive (MR) sensor, the method comprising:
- selecting device parameters for a first N-channel field-effect transistor (NFET) and a second NFET within the protection circuit;
- configuring at least one positive-negative (PN) diode within the protection circuit;
- adjusting device parameters for the first NFET, for the second NFET and for the at least one PN diode;
- selecting substrate bias voltages for the first NFET and for the second NFET;
- configuring a forward-biased diode and a reverse-biased diode within the protection circuit; and
- adjusting device parameters for the at least one PN diode, the forward-biased diode and the reverse-biased diode.

8. The method of claim 7, wherein selecting device parameters for the first NFET further comprises selecting at least one of: a threshold voltage, a gate length, a gate width, an off-state leakage current, and a NFET doping profile.

9. The method of claim 7, wherein selecting device parameters for the second NFET further comprises selecting at least one of: a threshold voltage, a gate length, a gate width, an off-state leakage current, and a NFET doping profile.

10. The method of claim 7, wherein device parameters for the first NFET and for the second NFET, respectively, are selected to limit, under normal operating conditions, leakage and displacement currents of the first NFET and of the second NFET, respectively.

11. The method of claim 10, wherein normal operating conditions include holding a substrate of the first NFET at a voltage level below a lowest voltage applied to a terminal of the first NFET, and above a voltage level that is a supply voltage (VDD) volts below the lowest voltage applied.

12. The method of claim 10, wherein normal operating conditions include holding a substrate of the second NFET at a voltage level below a lowest voltage applied to a terminal of the second NFET, and above a voltage level that is a supply voltage (VDD) volts below the lowest voltage applied.

13. The method of claim 7, wherein device parameters are selected, for the first NFET, to enable it to shunt sufficient current away from the MR sensor to protect it from electrical damage during an electrostatic discharge (ESD) event where the voltage of an MR sensor positive terminal is greater than the voltage of an MR sensor negative terminal.

14. The method of claim 7, wherein device parameters are selected, for the second NFET, to enable it to shunt sufficient current away from the MR sensor to protect it from electrical damage during an electrostatic discharge (ESD) event where the voltage of an MR sensor negative terminal is greater than the voltage of an MR sensor positive terminal.

15. The method of claim 7, wherein the configuring at least one PN diode within the protection circuit further comprises connecting, in a forward-based orientation between a positive terminal and a negative terminal of the MR sensor, a PN diode.

16. The method of claim 7, wherein the configuring at least one PN diode within the protection circuit further comprises connecting, in a reverse-based orientation between the MR sensor positive terminal and the MR sensor negative terminal, a PN diode.

17. The method of claim 7, wherein adjusting device parameters for the first NFET, for the second NFET and for the at least one PN diode further comprises adjusting, to limit parasitic capacitance and leakage current, at least one device width of a group of device width consisting of: a first NFET width, a second NFET width and an at least one PN diode width.

18. The method of claim 7, wherein selecting substrate bias voltages for the first NFET and for the second NFET further comprises selecting NFET substrate bias voltages in a range between a negative terminal operating voltage of the MR sensor and a supply voltage (VDD) volts below the negative terminal operating voltage.

19. The method of claim 7, wherein configuring forward-biased diodes and reverse-biased diodes within the protection circuit further comprises connecting a plurality of diodes in a series-connected forward-biased orientation from a negative terminal of the MR sensor to the substrate of a NFET in the MR sensor protection circuit.

20. A magneto-resistive (MR) sensor device comprising:
- an MR sensor having a safe operating voltage range, a normal operating voltage range within the safe operating voltage range, and two terminals coupled to a read channel circuit, including a positive terminal and a negative terminal;
- an MR sensor protection circuit having:
  - a positive protection threshold voltage range outside of and above the normal operating voltage range and within the safe operating voltage range;
  - a negative protection threshold voltage range outside of and below the normal operating voltage range and within the safe operating voltage range;
  - a field-effect transistor (FET) that is coupled to the positive terminal and to the negative terminal, and configured to, in response to a voltage between the two terminals being within the positive protection threshold voltage range, limit the voltage between the terminals by shunting current between the positive terminal and the negative terminal, and;
  - a field-effect transistor (FET) that is coupled to the positive terminal and to the negative terminal, and configured to, in response to the voltage between the two terminals being within the negative protection threshold voltage range, limit the voltage between the terminals by shunting current between the positive terminal and the negative terminal.

* * * * *